US009685527B2

(12) United States Patent
Cho

(10) Patent No.: US 9,685,527 B2
(45) Date of Patent: Jun. 20, 2017

(54) METHODS OF FORMING METAL SILICIDE LAYERS INCLUDING DOPANT SEGREGATION

(71) Applicant: Samsung Electronics Co., Ltd., Suwon-si, Gyeonggi-do (KR)

(72) Inventor: Choong-Rae Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/045,662

(22) Filed: Feb. 17, 2016

(65) Prior Publication Data

US 2016/0240627 A1 Aug. 18, 2016

(30) Foreign Application Priority Data

Feb. 17, 2015 (KR) ........................ 10-2015-0024237

(51) Int. Cl.
| | |
|---|---|
| H01L 21/336 | (2006.01) |
| H01L 29/66 | (2006.01) |
| H01L 21/285 | (2006.01) |
| H01L 21/225 | (2006.01) |
| H01L 21/265 | (2006.01) |
| H01L 29/423 | (2006.01) |
| H01L 21/768 | (2006.01) |
| H01L 27/108 | (2006.01) |

(52) U.S. Cl.
CPC ........ *H01L 29/665* (2013.01); *H01L 21/2254* (2013.01); *H01L 21/26513* (2013.01); *H01L 21/28518* (2013.01); *H01L 21/76843* (2013.01); *H01L 21/76855* (2013.01); *H01L 29/4236* (2013.01); *H01L 27/10855* (2013.01)

(58) Field of Classification Search
CPC ............... H01L 29/665; H01L 21/2254; H01L 21/26513; H01L 21/28518
See application file for complete search history.

(56) References Cited

U.S. PATENT DOCUMENTS

| | | | | |
|---|---|---|---|---|
| 6,987,050 B2 * | 1/2006 | Cabral, Jr. | ........ | H01L 21/28518 257/E21.165 |
| 7,402,512 B2 | 7/2008 | Derraa et al. | | |
| 8,173,093 B2 | 5/2012 | Oda et al. | | |
| 8,603,881 B1 * | 12/2013 | Alptekin | .......... | H01L 29/41783 257/E21.409 |

(Continued)

FOREIGN PATENT DOCUMENTS

| | | |
|---|---|---|
| JP | 06-120168 | 4/1994 |
| JP | 07-147402 | 6/1995 |

(Continued)

OTHER PUBLICATIONS

Feste et al. "Formation of steep, low Schottky-barrier contacts by dopant segregation during nickel silicidation", Journal of Applied Physics, 107, 044510 (2010).

(Continued)

*Primary Examiner* — Bradley K Smith
(74) *Attorney, Agent, or Firm* — Myers Bigel, P.A.

(57) ABSTRACT

A method of forming a metal silicide layer can include implanting dopants to a first depth below a surface of a semiconductor substrate including an active area. A metal-silicon composite layer can be formed on the semiconductor substrate and the metal-silicon composite layer can be silicided to form the metal silicide layer on the active area.

17 Claims, 25 Drawing Sheets

(56) References Cited

U.S. PATENT DOCUMENTS

| | | | |
|---|---|---|---|
| 2010/0327375 A1* | 12/2010 | Lee | H01L 21/26513 |
| | | | 257/408 |
| 2012/0009771 A1 | 1/2012 | Cabral, Jr. et al. | |
| 2014/0162442 A1 | 6/2014 | Khaja et al. | |

FOREIGN PATENT DOCUMENTS

| | | |
|---|---|---|
| KR | 10-2001-0044869 A | 6/2001 |
| KR | 10-2001-0063706 A | 7/2001 |
| KR | 10-2001-0080635 A | 8/2001 |
| KR | 10-2001-0084418 A | 9/2001 |
| KR | 10-2005-0067447 A | 7/2005 |
| KR | 10-2005-0069412 A | 7/2005 |
| KR | 10-2009-0033665 A | 4/2009 |

OTHER PUBLICATIONS

Geng et al. "Image Charge and Dipole Combination Model for the Schottky Barrier Tuning at the Dopant Segregated Metal/Semiconductor Interface", IEEE Electron Device Letters, vol. 30, No. 9, pp. 963-965, Sep. 2009.

Nishi et al. "Schottky barrier height modulation by atomic dipoles at the silicide/silicon interface", Physical Review B, 84, 115323 (2011).

Qiu et al. "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008.

Sadigh et al. "Large enhancement of boron solubility in silicon due to biaxial stress", Applied Physics Letters, 80, 4738 (2002).

Yamauchi et al. "Novel doping technology for a 1nm NiSi/Si junction with dipoles comforting Schottky (DCS) barrier", IEEE International Electron Devices Meeting, pp. 963-966 (2007).

Zhang et al. "Effective Schottky Barrier Lowering for Contact Resistivity Reduction Using Silicides as Diffusion Sources", 2010 International Symposium on VLSI Technology Systems and Applications (VLSI-TSA), pp. 154-155, IEEE (2010).

\* cited by examiner

METHODS OF FORMING METAL SILICIDE LAYERS INCLUDING DOPANT SEGREGATION

CROSS-REFERENCE TO RELATED APPLICATION

This application claims the benefit of Korean Patent Application No. 10-2015-0024237, filed on Feb. 17, 2015, in the Korean Intellectual Property Office, the disclosure of which is incorporated herein in its entirety by reference.

BACKGROUND

The inventive concept relates to a method of manufacturing a semiconductor device, and more particularly, to a method of forming a metal silicide layer having a low contact resistance.

In forming a contact of a semiconductor device, a process of forming a low-resistance contact is performed for improving interfacial resistance characteristics. The process of forming the low-resistance contact may include a process of forming a metal silicide layer. For example, a metal oxide thin film (e.g., a cobalt silicide ($CoSi_x$) or nickel silicide ($NiSi_x$) thin film) may be formed by depositing a metal thin film (e.g., a cobalt (Co) or nickel (Ni) thin film) on a surface of a silicon substrate or a polysilicon substrate and performing a heat treatment thereon. Furthermore, in order to form the low-resistance contact, a process of implanting impurity ions into source/drain regions and activating the implanted impurity ions may be performed.

SUMMARY

According to an aspect of the inventive concept, a method of forming a metal silicide layer can include implanting dopants to a first depth below a surface of a semiconductor substrate including an active area. A metal-silicon composite layer can be formed on the semiconductor substrate and the metal-silicon composite layer can be silicided to form the metal silicide layer on the active area.

According to an aspect of the inventive concept, a method of forming a metal silicide layer can include forming a doped layer including segregation dopants on a surface of a semiconductor substrate. A metal-silicon composite layer can be formed by depositing a metal and silicon on the doped layer and a metal silicide layer can be formed by siliciding the metal-silicon composite layer.

According to an aspect of the inventive concept, a method of manufacturing a semiconductor device can include forming an insulating layer on a semiconductor substrate including an active region. A contact hole can be formed through the insulating layer to expose the active region. Silicon and a metal can be provided to the active region in the contact hole. A silicidation process can be performed on the silicon and the metal in the contact hole to provide the metal silicide layer on the active region in the contact hole and a metal contact layer can be formed on the metal silicide layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
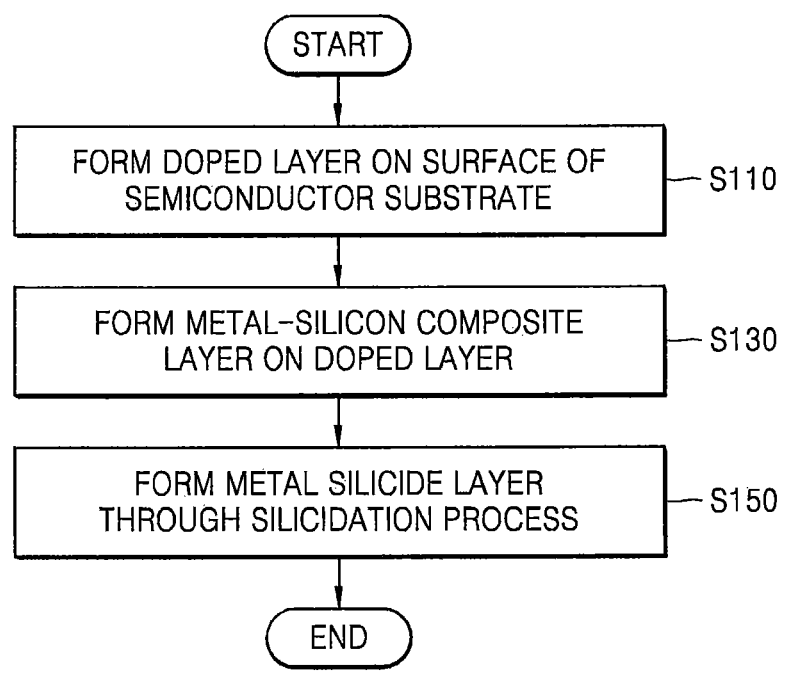
FIG. 1 is a flowchart of a method of forming a metal silicide layer, according to an embodiment.

The inventive concepts are described hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
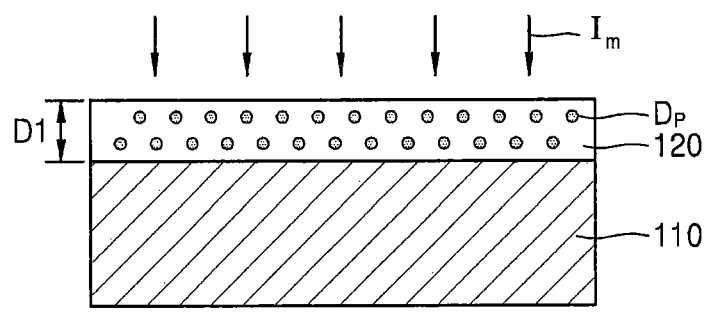
FIGS. 2A to 2C are cross-sectional views corresponding to the flowchart of FIG. 1 that shows the method of forming the metal silicide layer.
Figure 2B:
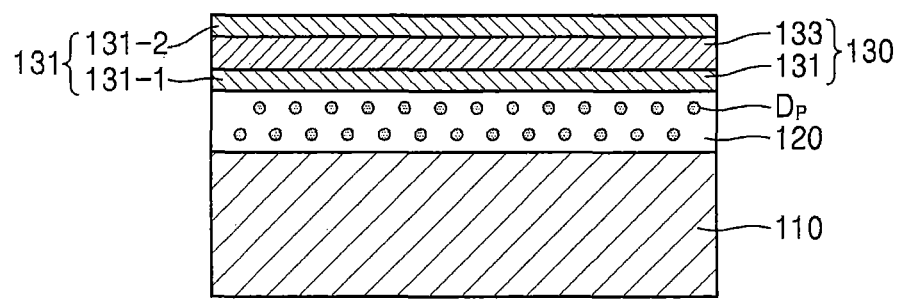
Figure 2C:
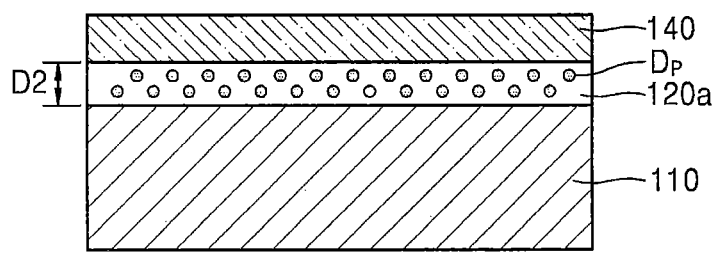

FIG. 1 is a flowchart of a method of forming a metal silicide layer, according to an embodiment, and FIGS. 2A to 2C are cross-sectional views corresponding to the flowchart of FIG. 1 that shows the method of forming the metal silicide layer.

Referring to FIGS. 1 and 2A, in operation S110, a doped layer 120 may be formed on a surface of a semiconductor substrate 110. The semiconductor substrate 110 may include silicon (Si). Silicon (Si) may include, for example, crystalline silicon (c-Si) or amorphous silicon (a-Si). In the method of forming the metal silicide layer, according to the present embodiment, the semiconductor substrate 110 may include crystalline silicon. However, the material of the semiconductor substrate 110 is not limited to silicon. For example, the semiconductor substrate 110 may include group IV semiconductors, such as germanium (Ge), group IV-IV compound semiconductors, such as silicon germanium (SiGe) and silicon carbide (SiC), or group III-V compound semiconductors, such as gallium arsenide (GaAs), indium arsenide (InAs), and indium phosphide (InP).

In the method of forming the metal silicide layer, according to the present embodiment, the semiconductor substrate 110 may be based on a silicon bulk wafer or a SiGe wafer. In addition, the semiconductor substrate 110 may be based on an epitaxial wafer, a polished wafer, or an annealed wafer.

The semiconductor substrate 110 may be a p-type or n-type substrate. For example, the semiconductor substrate 110 may be a p-type substrate including p-type impurity ions or an n-type substrate including n-type impurity ions. The semiconductor substrate 110 may include an active region defined by an element isolation layer such as a shallow trench isolation (STI). The active region may be formed by implanting dopants, i.e., impurity ions, into the semiconductor substrate 110 at a high concentration. For example, the active region may be a source/drain region formed by implanting dopants into the semiconductor substrate 110 at a concentration of $1E20/cm^3$ or more.

As indicated by arrows, the doped layer 120 may be formed by implanting dopants $D_p$, into the semiconductor substrate 110 to a very small thickness (i.e., shallow). For example, the doped layer 120 having a first thickness D1 may be formed by implanting p-type or n-type dopants $D_p$ into the semiconductor substrate 110 to a very small thickness. The first thickness D1 may be several nanometers, for example, about 2 nanometers to about 3 nanometers.

The dopant implantation may be performed with a very low implantation energy. For example, the dopant implantation may be performed with an implantation energy of several hundreds of eV. The dopant implantation may include plasma or cluster ion implantation. The dopant implantation may be performed in a way of reducing projection profile (Rp) and maintaining throughput.

The dopants $D_p$ may be, for example, a general p-type or n-type impurity element, such as boron (B), phosphorus (P), and arsenic (As). In addition, the dopants $D_p$ may be a chalcogen element, such as sulfur (S), selenium (Se), and tellurium (Te).

As described above, the semiconductor substrate 110 may include the active region, and the doped layer 120 may be formed on the active region. The doped layer 120 may be formed before or after the dopants for formation of the active region are implanted into the active region. When the doped layer 120 is formed after the dopants for formation of the active region are implanted into the active region, the doped layer 120 may be formed in-situ.

Referring to FIGS. 1 and 2B, in operation S130, a metal-silicon composite layer 130 may be formed on the doped layer 120. The metal-silicon composite layer 130 may have a structure in which a silicon layer 131 and a metal layer 133 are alternately stacked. The silicon layer 131 may be formed using amorphous silicon (a-Si) by a physical vapor deposition (PVD) process or a chemical vapor deposition (CVD) process. The metal layer 133 may be formed using a metal for formation of a metal silicide layer (140 in FIG. 2C). The metal layer 133 may include, for example, a noble metal or a near noble metal, such as cobalt (Co), nickel (Ni), and platinum (Pt). The metal layer 133 also may be formed by a PVD process or a CVD process.

Figure 4A:
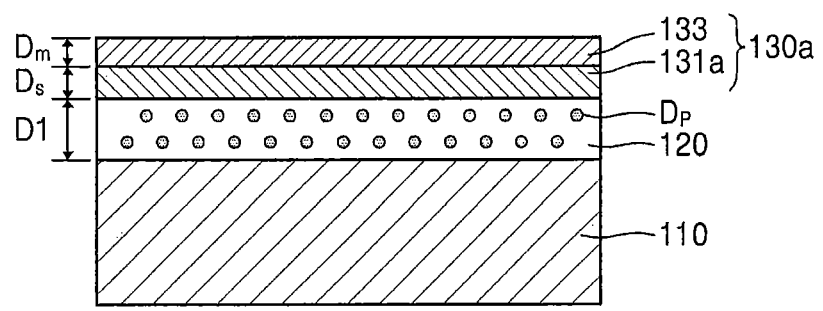
FIGS. 4A and 4B are cross-sectional views for describing a method of forming a metal silicide layer, according to an embodiment.
Figure 4B:
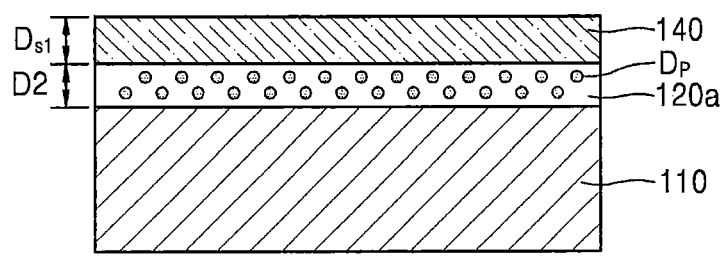

The forming of the metal-silicon composite layer 130 may include forming the silicon layer 131 on the doped layer 120, forming the metal layer 133 on the silicon layer 131, and forming the silicon layer 131 on the metal layer 133. The metal-silicon composite layer 130 is illustrated in FIG. 2B as including three layers, but the layer number of the metal-silicon composite layer 130 is not limited to three. For example, the metal-silicon composite layer 130 may include four or more layers or two layers. A structure in which the metal-silicon composite layer 130 includes two layers is illustrated in FIGS. 4A and 4B.

As illustrated in FIG. 2B, the metal-silicon composite layer 130 may have a structure in which a silicon layer 131 and a metal layer 133 are distinguished. In such a structure in which the silicon layer 131 and the metal layer 133 are distinguished, the silicon layer 131 may be first formed on the doped layer 120, but in some cases, the metal layer 133 may be first formed on the doped layer 120. Which layer is first formed on the doped layer 120 may be depending on how much silicon inside the doped layer 120 is required in the metal silicide layer (140 in FIG. 2C) to be formed. This will be described in more detail with reference to FIGS. 4A and 4B.

The metal-silicon composite layer 130 may be formed without distinction of the silicon layer 131 and the metal layer 133. For example, the metal-silicon composite layer 130 may be a mixture in which silicon and metal are mixed with each other in a single layer. In such a case where the metal-silicon composite layer 130 is formed without distinction of the silicon layer 131 and the metal layer 133, the metal-silicon composite layer 130 may be formed through co-sputtering deposition or composite target sputtering deposition. The co-sputtering deposition may refer to a method of simultaneously sputtering and depositing two targets, i.e., a silicon target and a metal target. The composite target sputtering deposition may refer to a method of sputtering and depositing a silicon-metal composite target. In the co-sputtering deposition and the composite target sputtering deposition, since silicon and metal are simultaneously supplied, the metal-silicon composite layer 130 having a mixture single-layer structure may be formed without distinction of the silicon layer 131 and the metal layer 133.

For reference, in comparison with the co-sputtering deposition or the composite target sputtering deposition, a method of forming the metal-silicon composite layer 130 having a double-layer or multi-layer of a metal layer and a silicon layer may be referred to as a metal/silicon double-layer or multi-layer deposition.

Referring to FIGS. 1 and 2C, in operation S150, a metal silicide layer 140 may be formed through a silicidation process. The silicidation process may be performed through a heat treatment at a certain temperature. A temperature of the heat treatment may be variously selected according to a type of a metal and characteristics of a required metal silicide layer 140. For example, when a nickel silicide layer is formed, a heat treatment may be performed at a low temperature of about 300° C. to about 500° C. so as to obtain a low contact resistance. However, the temperature of the heat treatment for silicidation is not limited thereto. The silicidation process may be performed through laser annealing. In this case, the silicidation process may be performed by locally irradiating a laser beam onto a region to be silicided.

The metal silicide layer 140, which is formed through the silicidation process, may also have a very small thickness. For example, the metal silicide layer 140 may have a thickness of 10 mil or less. A thickness relationship of the silicon layer 131, the metal layer 132, and the metal silicide layer 140 will be described in more detail with reference to FIGS. 4A and 4B.

A thickness of a doped layer 120a after the forming of the metal silicide layer 140 through the silicidation process may be less than a thickness of the doped layer 120 before the forming of the metal silicide layer 140. For example, the doped layer 120a after the forming of the metal silicide layer 140 may have a second thickness D2 that is less than the first thickness D1. Because silicon of the doped layer 120 is used for silicidation during the silicidation process.

More specifically, silicon of the doped layer 120 may be used for silicidation during the silicidation process. In addition, as silicon of the doped layer 120 is consumed for silicidation, a position of an interface between the metal silicide layer 140 and the doped layer 120a may gradually move. For example, the position of the interface between the metal silicide layer 140 and the doped layer 120a may move toward the semiconductor substrate 10, so the thickness of the doped layer 120a may be reduced.

During the silicidation process, the dopants inside the metal silicide layer 140 may be pushed out toward the interface between the metal silicide layer 140 and the doped layer 120a. The phenomenon that the dopants are pushed out toward the interface and aggregated on the interface is referred to as dopant segregation. Therefore, for the purpose of dopant segregation, a certain concentration of dopants may be implanted into the metal-silicon composite layer 130.

However, since the dopants of an upper region of the doped layer 120a act as dopant segregation, no dopants may be implanted into the metal-silicon composite layer 130. In other words, as described above, some silicon of the doped layer 120a may be used for silicidation and be transformed into the metal silicide layer 140. Accordingly, the dopants inside the upper region of the doped layer 120a, which are transformed into the metal silicide layer 140, may be pushed out toward the interface between the metal silicide layer 140 and the doped layer 120a during the silicidation process and act as dopant segregation.

For reference, in order to reduce a contact resistance between the metal layer and the silicon layer, it is necessary to stably activate the dopants in the interface between the metal layer and the silicon layer and to form a thin junction by confining the dopants to the interface at a heavy dose. When the dopants are aggregated near the interface, dopant solubility or activation greatly increases even at a low temperature of about 500° C. and a Schottky barrier height (SBH) decreases, thus contributing to a reduction in a contact resistance. In contrast, when the dopants are not confined near the interface, for example, to a thickness of several nanometers from the interface, the performance of the semiconductor device may be degraded due to an increase in off-current, a reduction in mobility, and an increase in a spreading resistance (Rspr).

A temperature may be raised for dopant activation. However, if the temperature is raised, diffusion also increases, thus disturbing dopant aggregation to the interface. In addition, it is general that a metal silicide layer is formed for reducing a contact resistance. However, when a position of an interface is changed according to a growth of the metal silicide layer and a thickness of the metal silicide layer increases, dopant dispersion may increase in the interface.

The position change of the interface and the increase in the dopant dispersion will be described below in more detail with reference to FIG. 5. The forming of the metal silicide layer may contribute to a reduction in an external resistance (Rext) as well as a channel resistance (Rch), but a resistance dispersion may increase due to silicide external growth, inhomogeneous phase, or the like.

As appreciated by the present inventive entity, another method of reducing a contact resistance, a super-saturation method of excessively implanting dopants into a silicon layer (e.g., a source/drain region) may be used. However, the super-saturation method may cause diffusion, deactivation, or the like according to a subsequent heat budget, thus degrading the performance of the semiconductor device. For example, in the case of a dynamic random access memory (DRAM), when impurity ions are super-saturated in a GBC contact of $CoSi_2$/poly-Si, a morphology of poly-Si may be degraded, a gate induced drain leakage (GIDL) may increase, and refresh interval time (tREF) characteristics may become worse. In addition, in the case of a NiSi/Si contact in a logic device, a spreading resistance (Rspr) may increase, an off-current may increase, and short-channel characteristics may be degraded.

In summary, in order to reduce the contact resistance between the metal layer and the silicon layer, the dopants are activated at a relatively low temperature; when the metal silicide layer is formed, the metal silicide layer is formed to have a very small thickness; and the dopants are aggregated to a very small thickness and at a high concentration on the interface between the metal silicide layer and the silicon layer, without dopant super-saturation of the silicon layer.

The method of forming the metal silicide layer, according to the present embodiment, may form a very thin metal silicide layer 140 having a thickness of several nanometers through silicidation using the metal-silicon composite layer 130 on the doped layer 120. In addition, while the metal silicide layer 140 is formed, the dopants may be aggregated in the interface between the metal silicide layer 140 and the doped layer 120a to a very small thickness due to dopant segregation. Accordingly, the dopants are aggregated or confined to a small thickness in the interface between the metal silicide layer 140 and the doped layer 120a and are then activated, thus minimizing the contact resistance (Re) in the interface without high-temperature heat treatment or dopant super-saturation of the silicon layer.

Since the doped layer 120a is a layer in which the dopants are implanted into the silicon layer of the substrate 110, the interface between the metal silicide layer 140 and the doped layer 120a may mean an interface between the metal silicide layer 140 and the silicon layer of the substrate 110. Hereinafter, this may be understood as the same concept.

Figure 3A:
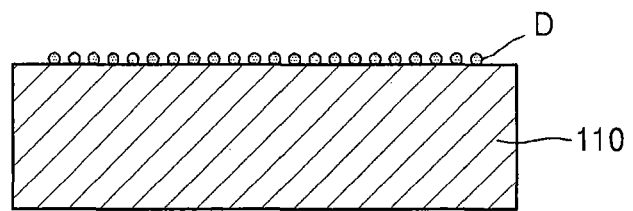
FIGS. 3A to 3C are cross-sectional views for describing a method of forming a doped layer on a surface of a substrate in FIG. 2A, according to another embodiment.
Figure 3B:
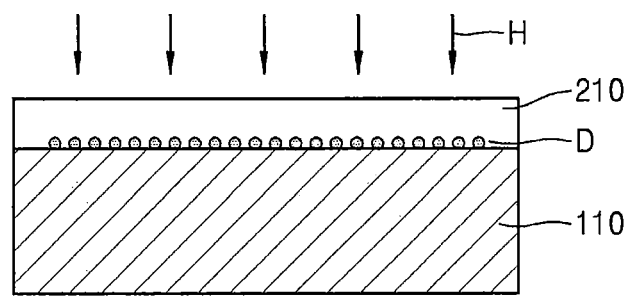
Figure 3C:
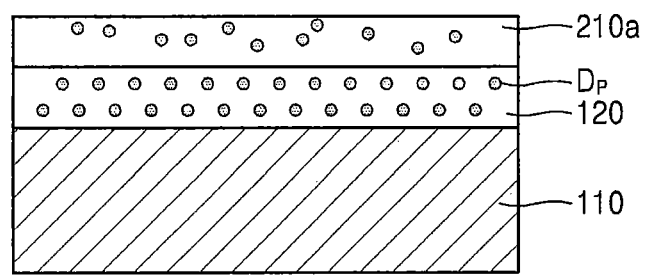

FIGS. 3A to 3C are cross-sectional views for describing a method of forming a doped layer on the semiconductor substrate 110 of FIG. 2A, according to another embodiment. Specifically, FIGS. 3A to 3C illustrate a method of forming a doped layer through diffusion.

Referring to FIG. 3A, dopants D may be formed on the semiconductor substrate 110. For example, the dopants D may be formed on the semiconductor substrate 110 to a very small thickness, for example, a single molecular layer level, by using a mono-layer doping (MLD) method. The dopants D may be a general impurity element, such as boron (B), phosphorus (P), and arsenic (As), or a chalcogen element, such as sulfur (S), selenium (Se), and tellurium (Te).

Referring to FIG. 3B, an insulating layer 210 may be formed on the semiconductor substrate 110 to cover the dopants D. The insulating layer 210 may be an oxide film or a nitride film. The insulating layer 210 may be, for example, a silicon oxide film or a silicon nitride film.

After the insulating layer 210 is formed, heat may be applied to diffuse the dopants D, as indicated by arrows H. Due to the diffusion of the dopants D, the dopants D may be moved to the semiconductor substrate 110 and the insulating layer 210.

Referring to FIG. 3C, due to the diffusion of the dopants D, a doped layer 120 may be formed on the surface of the semiconductor substrate 110. Specifically, most of the dopants D may be moved to an upper portion of the semiconductor substrate 110 due to the diffusion of the dopants D, and some of the dopants D may remain in the insulating layer 210a and diffuse within the insulating layer 210a. Dopants $D_p$, which are moved to the semiconductor substrate 110, may constitute the doped layer 120.

The doped layer 120 may be formed to have a very small thickness of several nanometers. After the doped layer 120 is formed by the diffusion of the dopants D, the insulating layer 210a on the doped layer 120 may be removed. The removing of the insulating layer 210a may realize a structure similar to a structure of FIG. 2A in which the doped layer 120 is formed on the surface of the semiconductor substrate 110. Consequently, while the doped layer 120 of FIG. 2A is formed by the implantation of the dopants, the doped layer 120 of the present embodiment is formed by the diffusion of the dopants. Although the manufacturing methods are different from each other, the final structures may be substantially similar to each other, as illustrated in FIGS. 2A and 3C.

FIGS. 4A and 4B are cross-sectional views for describing a method of forming a metal silicide layer, according to an embodiment.

Referring to FIG. 4A, a doped layer 120 may be formed on a surface of a semiconductor substrate 110, as described with reference to FIG. 2A. The doped layer 120 may be formed to have a first thickness D1 and may be formed by implantation or diffusion of dopants D. The first thickness D1 may be several nanometers, for example, about 2 nanometers to about 3 nanometers.

After the doped layer 120 is formed, a metal-silicon composite layer 130a may be formed on the doped layer 120. In the method of forming the metal silicide layer, according to the present embodiment, the metal-silicon composite layer 130a may include a silicon layer 131a and a metal layer 133 and may have a double layer structure as illustrated in FIG. 4A. However, the present embodiment is not limited thereto. The metal-silicon composite layer 130a may have a triple or more structure. In some cases, the metal-silicon composite layer 130a may have a single-layer structure including a mixture of metal and silicon.

There may be a certain ratio relationship between a thickness $D_s$ of the silicon layer 131a and a thickness $D_m$ of the metal layer 133. More specifically, the thickness $D_m$ of the metal layer 133 and the thickness $D_s$ of the silicon layer 131a, which are used when the metal silicide layer is formed through silicidation, may have a certain ratio. In addition, the formed metal silicide layer may have a thickness of a certain ratio with respect to the metal layer 133 or the silicon layer 131a. For example, in the case of forming a nickel silicide layer, a thickness ratio of a nickel layer to a silicon layer may be about 1:1.8. In addition, the formed nickel silicide layer may have a relative thickness of about 1:2.2 with respect to the nickel layer.

In the method of forming the metal silicide layer, according to the present embodiment, silicon inside the doped layer 120 may be used for forming the metal silicide layer. Therefore, the thickness $D_s$ of the silicon layer 131a, which is formed in the metal-silicon composite layer 130a for formation of the metal silicide layer, may be less than the thickness of the silicon layer, which is commonly required for forming the metal silicide layer. For example, in the case of forming a nickel silicide layer, when the thickness $D_m$ of the metal layer 133 in the metal-silicon composite layer 130a is 1, the thickness $D_s$ of the silicon layer 131a may be about 1.5. In addition, as in the structure of FIG. 2B, when the silicon layer 131 is formed above and below the metal layer 133, the thickness of the silicon layer 131 may be about 1.5, including two layers, i.e., a lower silicon layer and an upper silicon layer.

Referring to FIG. 4B, a metal silicide layer 140 may be formed through a silicidation process. The silicidation process may be performed through a heat treatment at a certain temperature, or may be performed through laser annealing. The metal silicide layer 140, which is formed through the silicidation process, may have a small thickness, for example, a thickness of about 10 nm or less.

The thickness of the metal silicide layer 140 may be less than the thickness of the metal-silicide composite layer 130a. For example, in the case of forming a nickel silicide layer, when the thickness of the metal layer 133 of FIG. 4A is 1, a thickness $D_{s1}$ of the formed metal silicide layer 140 may be about 2.2. In addition, since the metal silicide layer 140 is formed by partially using silicon inside the doped layer 120a, the second thickness D2 of the doped layer 120a after the forming of the metal silicide layer 140 may be less than the first thickness D1 of the doped layer 120 before the forming of the metal silicide layer 140. In numerical terms, 1.5 of the silicon layer is used instead of 1.8. Thus, about 0.3 of silicon inside the doped layer 120a is used. Consequently, the doped layer 120a may be reduced by the thickness corresponding to about 0.3 of silicon after the forming of the metal silicide layer 140. However, the reduced thickness of the doped layer 120a is not limited to the above numerical value.

As described above, the thickness of the doped layer 120a is reduced after the metal silicide layer 140 is formed, and as the interface moves downward, the dopants $D_p$ are pushed out toward the interface between the metal silicide layer 140 and the doped layer 120a due to dopant segregation. Therefore, the dopants $D_p$ may be aggregated and activated in the interface between the metal silicide layer 140 and the doped layer 120a at a very small thickness, contributing to a reduction in a contact resistance between the metal silicide layer 140 and the silicon layer.

Figure 5:
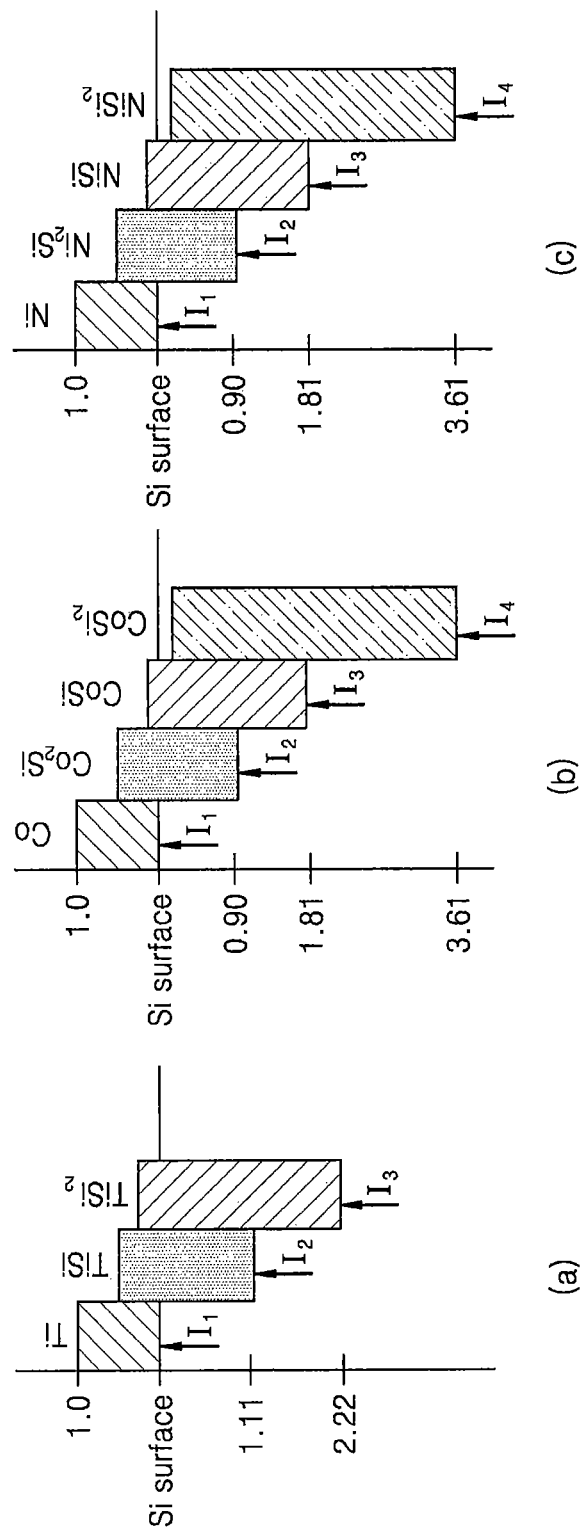
FIG. 5 is a diagram describing a definition of an interface in a silicidation process of several metals.

FIG. 5 is a diagram describing a definition of an interface in the process of silicidation of several metals. (a) of FIG. 5 illustrates silicidation of titanium (Ti), (b) of FIG. 5 illustrates silicidation of cobalt (Co), and (c) of FIG. 5 illustrates silicidation of nickel (Ni).

Referring to FIG. 5, as the silicidation process is performed, interfaces $I_1$, $I_2$, $I_3$, and $I_4$ between a silicidation layer and a silicon layer gradually move downward. More specifically, in the (a) case of Ti, immediately after a Ti layer is formed to have a (relative) thickness of 1, a surface of the silicon layer may correspond to a first interface $I_1$. When a first titanium silicide (TiSi) layer is formed through silicidation, the interface moves inside the silicon layer. Accordingly, an inner portion of the silicon layer corresponding to a thickness of 1.11 may correspond to a second interface $I_2$. Subsequently, silicidation is further performed to form a second titanium silicide layer (TiSi$_2$), and the interface further moves inside the silicon layer. Accordingly, an inner portion of the silicon layer corresponding to a thickness of 2.22 may correspond to a third interface $I_3$.

In the (b) case of Co, as silicidation is performed on a surface of a silicon layer, i.e., a first interface $I_1$, the interface gradually moves inside the silicon layer in the order of a second interface $I_2$ of a first cobalt silicide (Co$_2$Si) layer, a third interface $I_3$ of a second cobalt silicide (CoSi) layer, and a fourth interface $I_4$ of a third cobalt silicide (CoSi$_2$) layer. Similarly, in the (c) case of Ni, as silicidation is performed on a surface of a silicon layer, i.e., a first interface $I_1$, the interface gradually moves inside the silicon layer in the order of a second interface $I_2$ of a first nickel silicide (Ni$_2$Si) layer, a third interface $I_3$ of a second nickel silicide (NiSi) layer, and a fourth interface $I_4$ of a third nickel silicide (NiSi$_2$) layer.

As described above, the inward movement of the interface through silicidation causes dopant segregation. However, as can be seen from the drawings, since the metal silicide layer is formed while penetrating into the silicon layer, it may be difficult to effectively confine dopants in the interface between the metal silicide layer and the silicon layer when the metal silicide layer is thickly formed.

More specifically, a dopant segregation method may be classified into an implantation before silicidation (IBS) method and an implantation after silicidation (IAS) method. As for the IBS method, dopants are implanted into a silicon layer before a metal silicide layer is formed, and dopant segregation is generated by performing silicidation thereon. As for the IAS method, dopants are implanted into a metal silicide layer after a metal silicide layer is formed, and dopant segregation is generated by performing the implantation and a heat treatment thereon.

In the case of the IBS method, when the metal silicide layer is thickly formed, dopants thinly implanted into the silicon layer at low implantation energy may not diffuse to the interface. Accordingly, dopants may be hardly aggregated in the interface. In addition, if dopants are deeply implanted into the silicon layer at high implantation energy, straggle increases and a dopant dispersion is worsened. Accordingly, dopants may be hardly aggregated in the interface.

For reference, as the implantation energy increases, a depth that reduces a dopant concentration by 10 times greatly increases. For example, if dopants are implanted at implantation energy of 1 keV, a depth that reduces a dopant concentration by 10 times is about 4 nm or less. However, if dopants are implanted at implantation energy of 10 keV, a depth that reduces a dopant concentration by 10 times is about 8 nm. This may mean that, as the implantation energy increases, a straggle of dopants increases so that dopants are not aggregated at a required position.

In addition, as the thickness of the metal silicide layer increases, a depth that reduces a dopant concentration by 10 times may increase. For example, in the case of a nickel silicide layer, even when dopants are implanted at implantation energy of 1 keV, if the nickel silicide layer is formed to have a thickness of 35 nm, a depth that reduces a dopant concentration by 10 times is about 6 nm. If the nickel silicide layer is formed to have a thickness of 50 nm, a depth that reduces a dopant concentration by 10 times is about 7.5 nm. Accordingly, the depth that reduces the dopant concentration increases as compared with 4 nm in a case where the nickel silicide layer is not formed.

On the other hand, in the case of the IAS method, since dopants are implanted into the metal silicide layer that has been already formed, the dopants may leak out through grain boundary or the like of the metal silicide layer. Thus, it may be difficult to effectively confine the dopants in the interface.

As appreciated by the present inventive entity, when the metal silicide layer is formed, reducing implantation energy and an effective thickness of the metal silicide layer may be advantageous to confinement or aggregation of dopants in the interface at high concentration.

On the other hand, in the silicidation of Ni in the (c) case, a resistance of the third nickel silicide ($NiSi_2$) layer may be relatively high. The third nickel silicide ($NiSi_2$) layer may be formed through a heat treatment of about 700° C. or more. Therefore, by maintaining a heat treatment temperature to be low, the silicidation may be limited up to the second nickel silicide (NiSi) layer. Thus, the interface may be maintained to the third interface $I_3$.

The method of forming the metal silicide layer, according to the present embodiment, may form the metal silicide layer by forming a metal-silicon layer on the silicon layer and siliciding the metal-silicon layer. Accordingly, the interface between the metal-silicon layer and the silicon layer may be positioned adjacent to the surface of the silicon layer. In addition, since the dopants of the silicon layer, e.g., the dopants of the doped layer, are segregated to a thin interface during silicidation, the dopants may be effectively confined and aggregated in the interface between the metal silicide layer and the silicon layer. Therefore, the method of forming the metal silicide layer, according to the present embodiment, may effectively overcome the limitations of the IBS method or the IAS method and minimize a contact resistance between the metal silicide layer and the silicon layer.

Figure 6A:
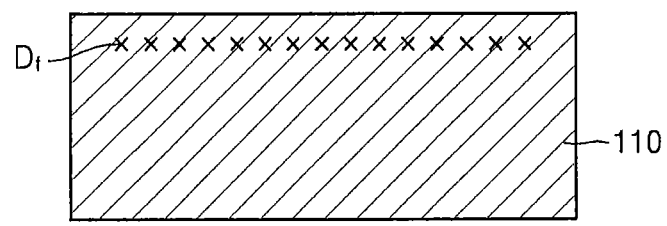
FIGS. 6A to 6C are cross-sectional views for describing a method of forming a metal silicide layer, according to an embodiment.
Figure 6B:
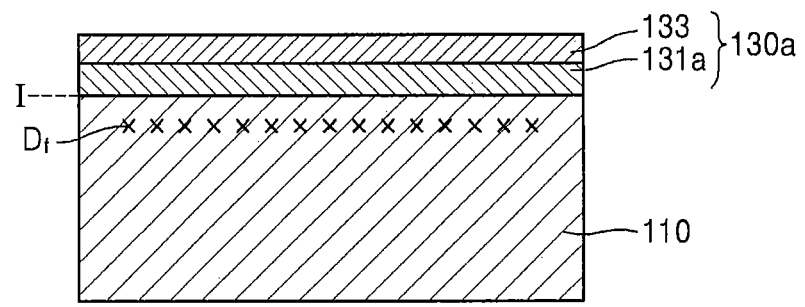
Figure 6C:
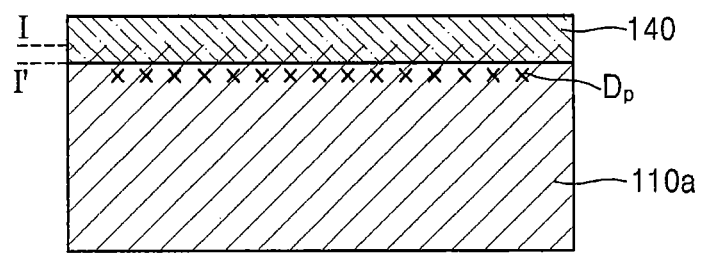

FIGS. 6A to 6C are cross-sectional views for describing a method of forming a metal silicide layer, according to an embodiment.

Referring to FIG. 6A, dopants $D_f$ may be implanted into a semiconductor substrate 110 to a certain depth. The implantation of the dopants $D_f$ may be one of methods of processing a surface of the semiconductor substrate 110. For example, the dopants $D_f$ implanted into the semiconductor substrate 110 may act as defects for Fermi level pinning. Generally, such defects may not contribute to a reduction in a contact resistance of an interface. An implantation depth of the dopants $D_f$ may be appropriately selected according to how much silicon of the semiconductor substrate 110 is used when a metal silicide layer is formed.

Referring to FIG. 6B, a metal-silicon composite layer 130a may be formed in the semiconductor substrate 110. The metal-silicon composite layer 130a may include a silicon layer 131a and a metal layer 133, as illustrated in FIG. 4A. A thickness of the silicon layer 131a and the metal layer 133 may be selected according to how much silicon of the semiconductor substrate 110 is used when a metal silicide layer is formed. For example, as described above with reference to FIGS. 4A and 4B, when the nickel silicide layer is formed, a thickness ratio of the metal layer 133 to the silicon layer 131a may be about 1:1.5. In addition, the thickness of silicon of the semiconductor substrate 110, which is used for forming the nickel silicide layer, may be about 0.3 times the thickness of the metal layer 133.

The metal-silicon composite layer 130a of FIG. 6B is formed to have a double layer structure including the silicon layer 131a and the metal layer 133 as illustrated in FIG. 4A, but is not limited thereto. The metal-silicon composite layer 130a may be formed to have a triple layer structure as illustrated in FIG. 2B. In addition, the metal-silicon composite layer 130a may be formed to have a quadruple-or-more layer structure. I may indicate the interface between the metal-silicon composite layer 130a and the silicon layer, i.e., the semiconductor substrate 110, immediately after the metal-silicon composite layer 130a is formed.

Referring to FIG. 6C, a metal silicide layer 140 may be formed by performing a silicidation process through a heat treatment or laser annealing. As illustrated, due to the silicidation process, the interface of the metal silicide layer 140 may move from I to I'. In other words, as the silicidation process is performed, silicon on the upper portion of the semiconductor substrate 110 is used for forming the metal silicide layer 140. Therefore, the interface may move inside the semiconductor substrate 110.

When the interface continuously moves and reaches a depth at which the dopants have been implanted, the dopants having acted as defects may act as dopants contributing to a reduction in a contact resistance of the interface. Consequently, the dopants having acted as defects may act as dopants $D_p$ aggregated on the interface through the formation of the metal silicide layer 140 as illustrated in FIG. 2C or 4B.

Figure 7:
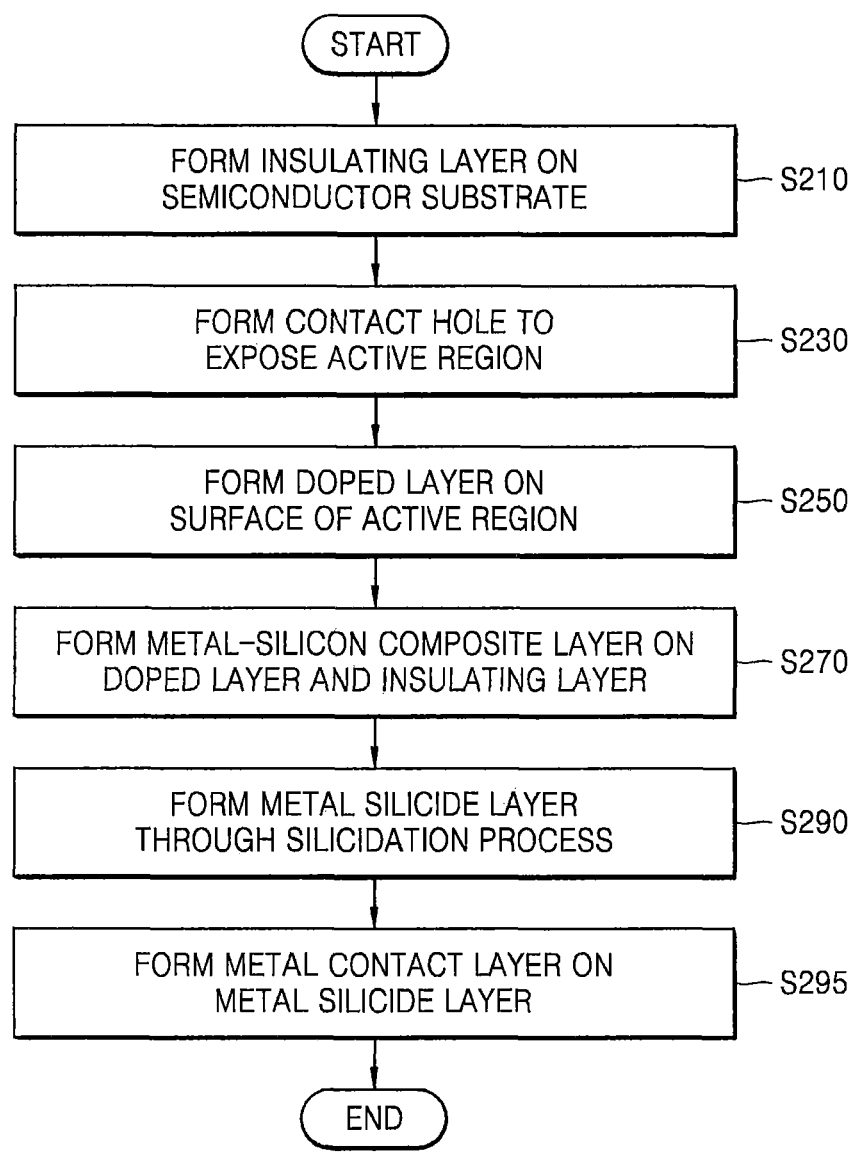
FIG. 7 is a flowchart of a method of forming a semiconductor device, according to an embodiment.

FIG. 7 is a flowchart of a method of manufacturing a semiconductor device, according to an embodiment, and FIGS. 8A to 8G are cross-sectional views corresponding to the flowchart of FIG. 7 that shows the method of forming the semiconductor device.

Figure 8A:
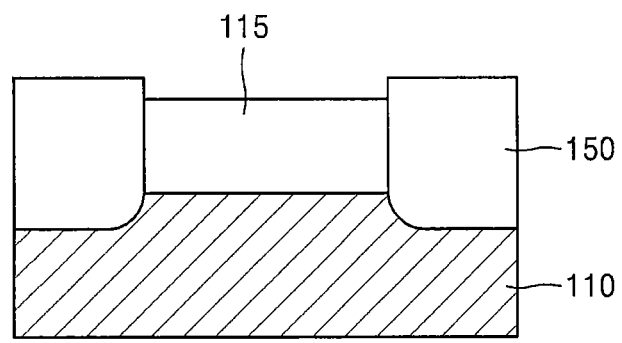
FIGS. 8A to 8G are cross-sectional views corresponding to the flowchart of FIG. 7 that shows the method of forming the semiconductor device.
Figure 8B:
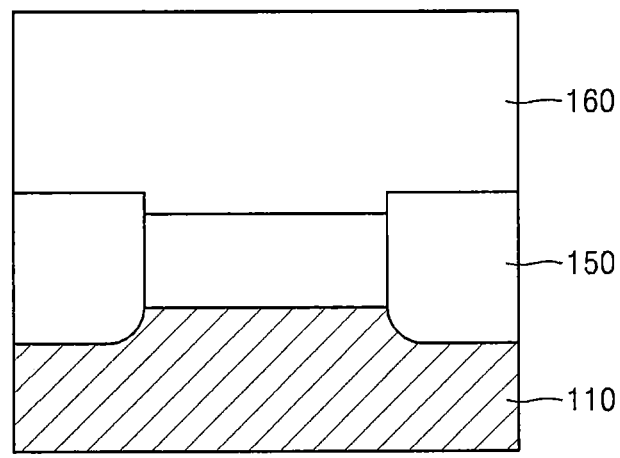

Referring to FIGS. 7, 8A, and 8B, an active region 115 may be defined on a semiconductor substrate 110 by an element isolation layer 150, such as STI. For example, the active region 115 may be a heavily doped region, such as a source/drain region. In operation S210, an insulating layer 160 may be formed on the active region 115 and the element isolation layer 150. The insulating layer 160 may be, for example, a silicon oxide film, a silicon nitride film, or a silicon oxynitride film.

Figure 8C:
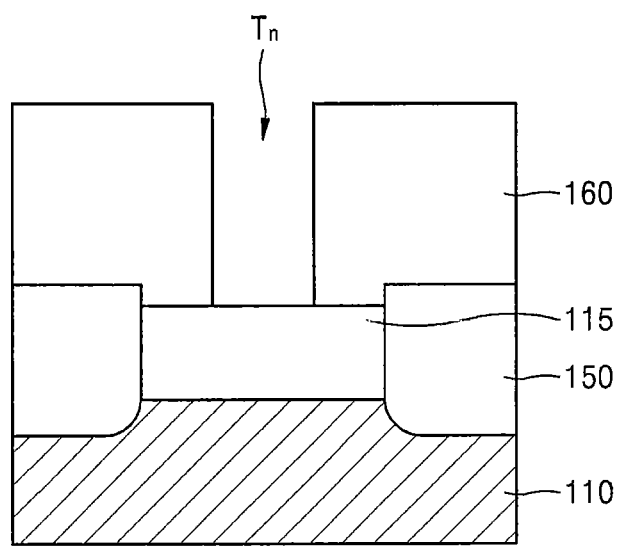

Referring to FIGS. 7 and 8C, in operation S230, a contact hole $T_n$ may be formed to expose the active region 115. The contact hole $T_n$ may be formed through a dry etching process by using a photomask pattern formed on the insulating layer 160 as an etching mask. After the contact hole $T_n$ is formed, the photomask pattern may be removed.

Figure 8D:
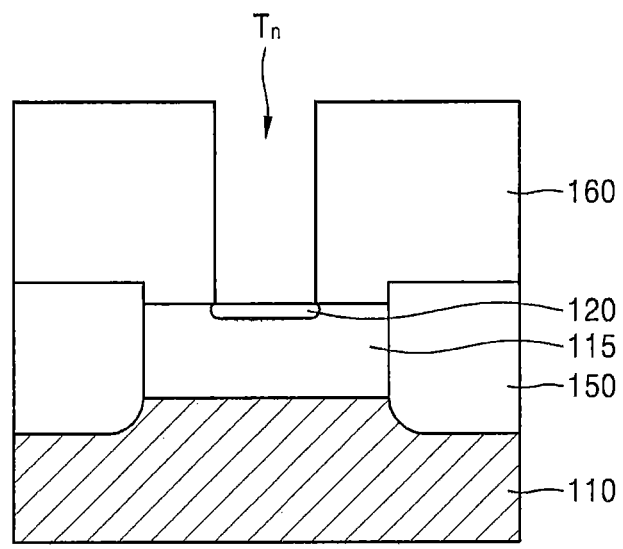

Referring to FIGS. 7 and 8D, in operation S250, a doped layer 120 may be formed by implanting dopants into the exposed active region. The forming of the doped layer 120 is not limited to the dopant implantation method. For example, the doped layer 120 may be formed through diffusion of dopants as described with reference to FIGS. 3A to 3C. The doped layer 120 may be formed to have a very small thickness of, for example, several nanometers.

Figure 8E:
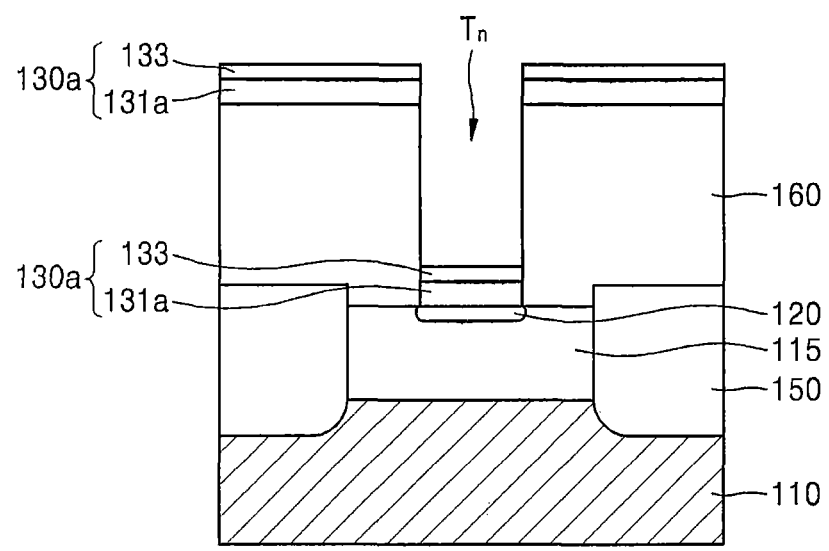

Referring to FIGS. 7 and 8E, in operation S270, a metal-silicon composite layer 130a may be formed on the doped layer 120 and the insulating layer 160. The metal-silicon composite layer 130a may have a double layer structure including the silicon layer 131a and the metal layer 133. However, the present embodiment is not limited thereto. The metal-silicon composite layer 130a may have a triple layer structure as illustrated in FIG. 2B, or may have a quadruple-or-more layer structure.

As described above, the silicon layer 131a and the metal layer 133 may be formed at an appropriate thickness ratio, taking into consideration how much silicon of the doped layer 120 is used. The metal-silicon composite layer 130a including the silicon layer 131a and the metal layer 133 may be formed to have a very thin and uniform thickness within the contact hole $T_n$ through a deposition process, such as a CVD process or a PVD process.

Due to deposition technologies, in particular, PVD technology, bottom coverage (B/C) within the contact hole can be improved in the forming of the metal layer such as the nickel layer or the titanium layer. In addition, a B/C of silicon is remarkably improved. For example, when a material layer is formed within a contact hole of about 20 nm, a B/C of a metal layer is about 80% to about 90%. In addition, a B/C of silicon is about 80% or more. The B/C is a thickness ratio of a material layer inside a contact hole to a material layer outside a contact hole and is a criterion of how well a material layer is formed on a bottom surface of a contact hole.

Figure 8F:
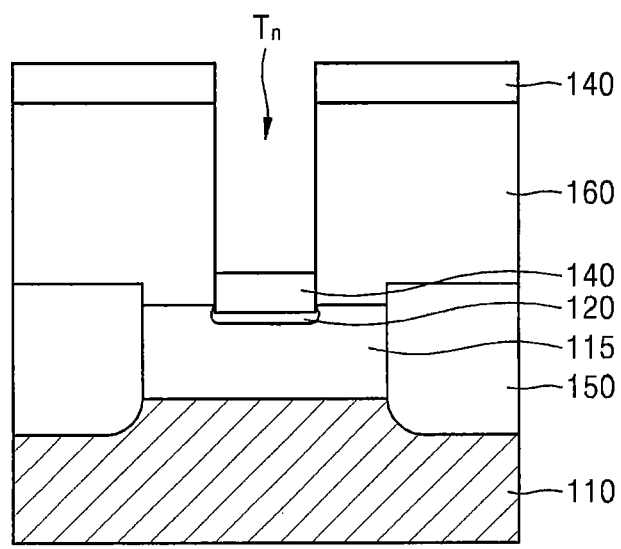

Referring to FIGS. 7 and 8F, in operation S290, a metal silicide layer 140 may be formed by performing a silicidation process on the metal-silicon composite layer 130a. The silicidation process may be performed through a heat treatment or laser annealing. Through the silicidation process, dopants may be aggregated in the interface between the silicide layer 140 and the silicon layer, i.e., the doped layer 120. More specifically, while the metal silicide layer 140 is formed, the dopants of the doped layer 120 may be segregated to the interface between the metal silicide layer 140 and the doped layer 120, and the interface between the metal silicide layer 140 and the doped layer 120 moves downward. Thus, a thickness of the doped layer 120 is reduced, so that the dopants are aggregated in the interface between the metal silicide layer 140 and the doped layer 120 at a high concentration.

Figure 8G:
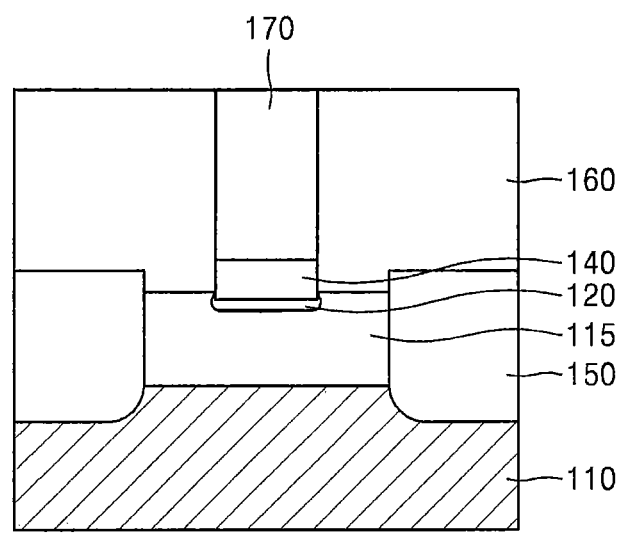

Referring to FIGS. 7 and 8G, in operation S295, after the metal silicide layer 140 is formed, a metal contact layer 170 may be formed on the metal silicide layer 140. The metal contact layer 170 may include, for example, tungsten (W). A material of the metal contact layer 170 is not limited to tungsten. The metal silicide layer 140 and the metal contact layer 170 on the insulating layer 160 may be removed through a CMP process.

After the metal contact layer 170 is formed, subsequent semiconductor processes may be performed to manufacture various semiconductor devices. The subsequent semiconductor processes may include, for example, a deposition process, an etching process, and a cleaning process. The deposition process may include various material layer forming processes, such as a CVD process, a sputtering process, and a spin coating process. The semiconductor processes may include a packaging process of mounting a semiconductor device on a printed circuit board (PCB) and sealing the semiconductor device by using a sealant. The semiconductor processes may include a test process of testing a semiconductor device or a package.

Figure 9A:
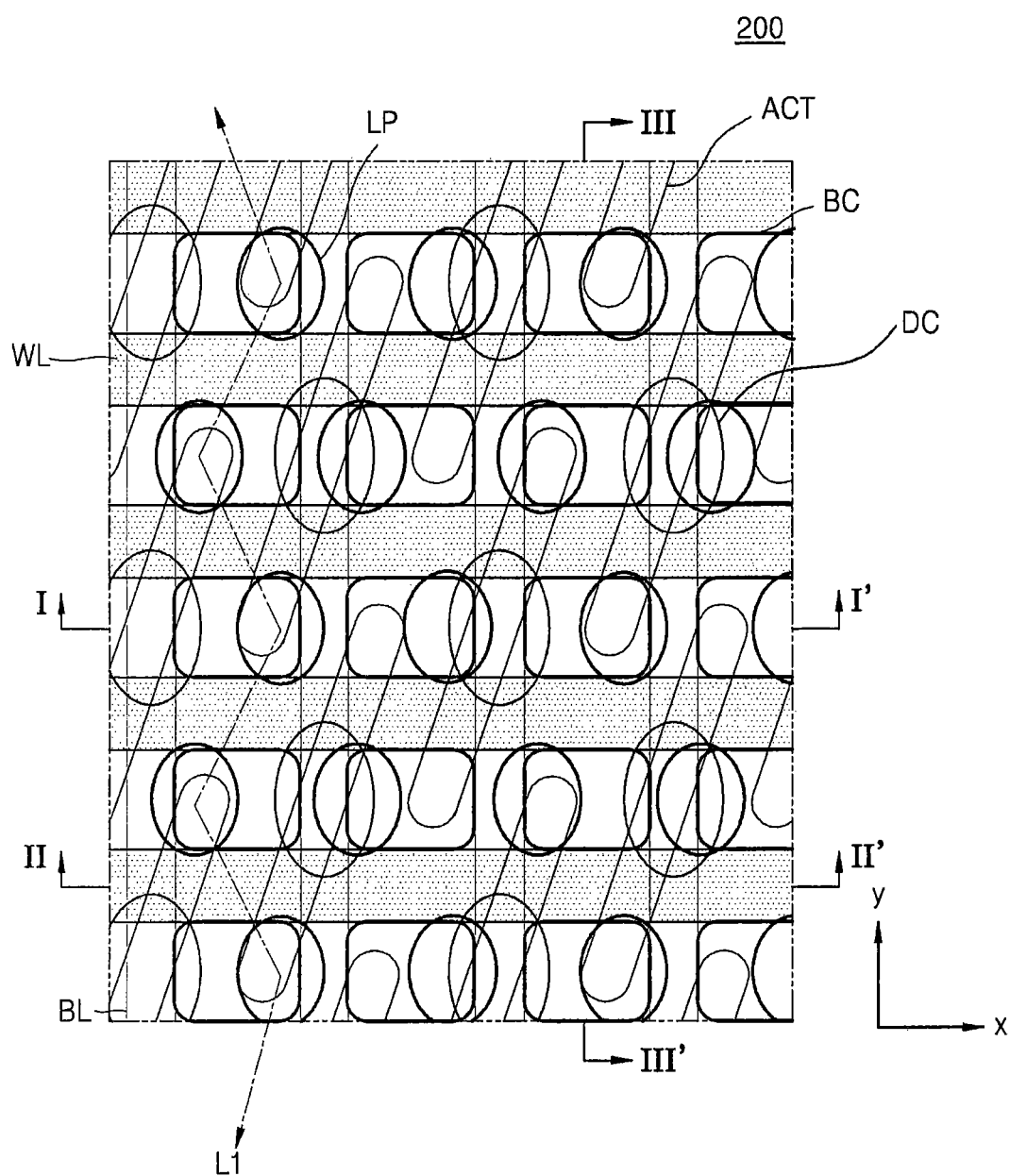
FIG. 9A is a plan view of a semiconductor device including a dynamic random access memory (DRAM), according to an embodiment.
Figure 9B:
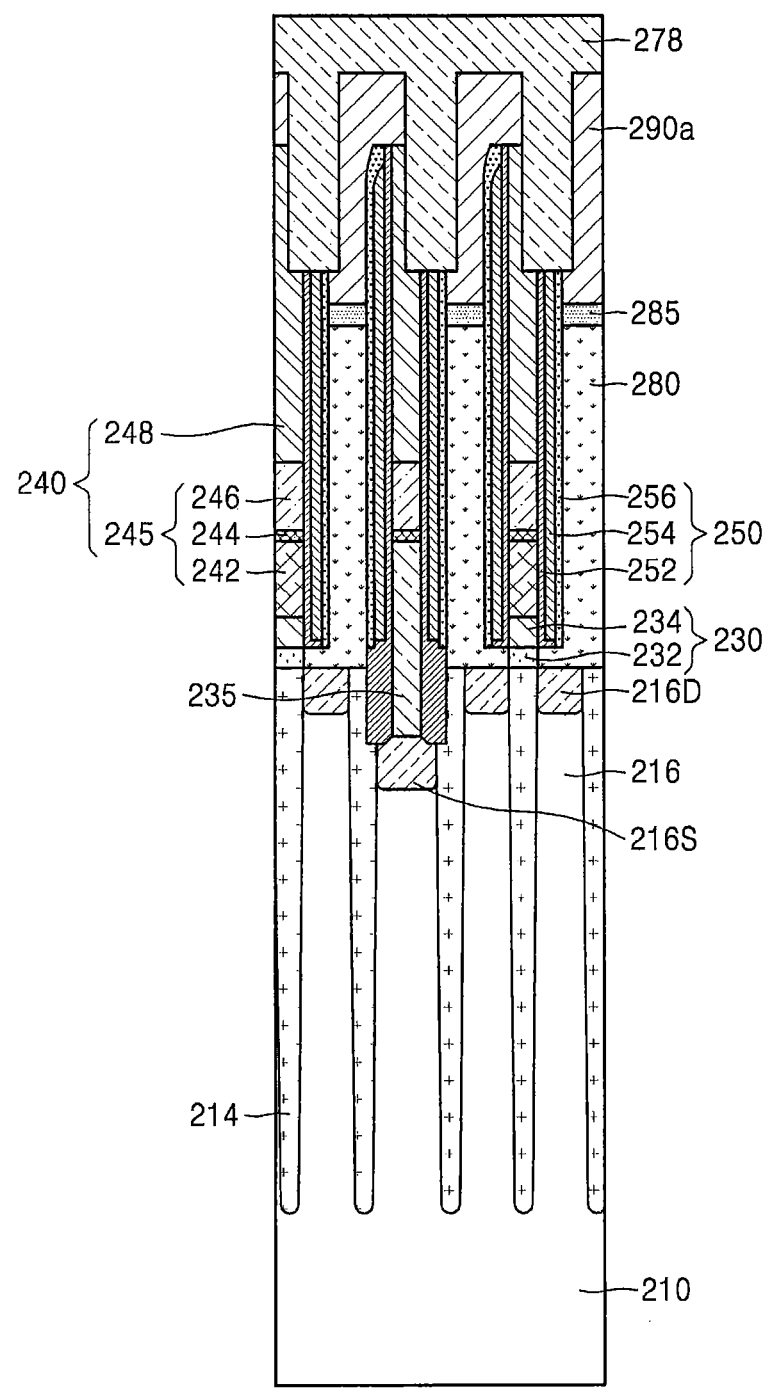
FIGS. 9B to 9D are respectively cross-sectional views taken along lines II-I', II-II', and III-III' of FIG. 9A.
Figure 9C:
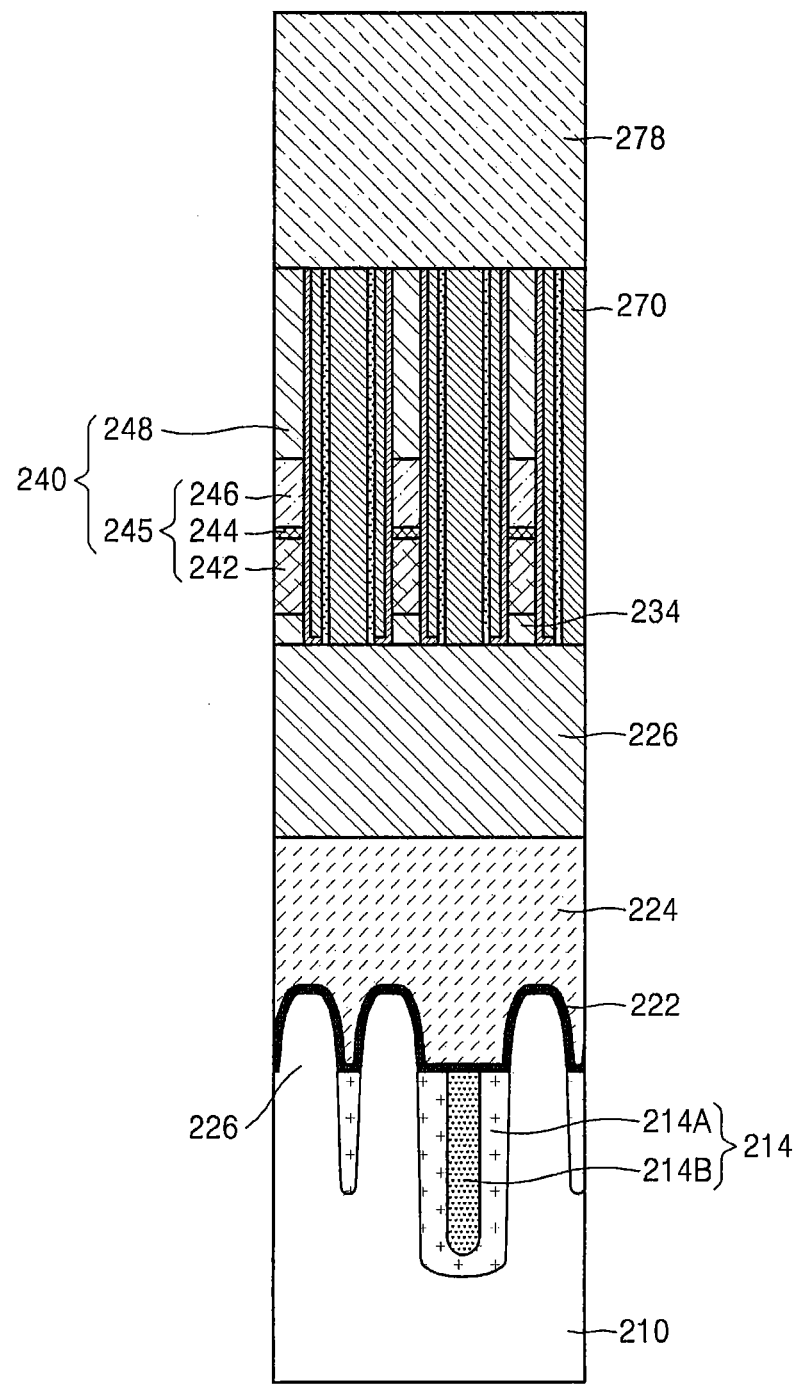
Figure 9D:
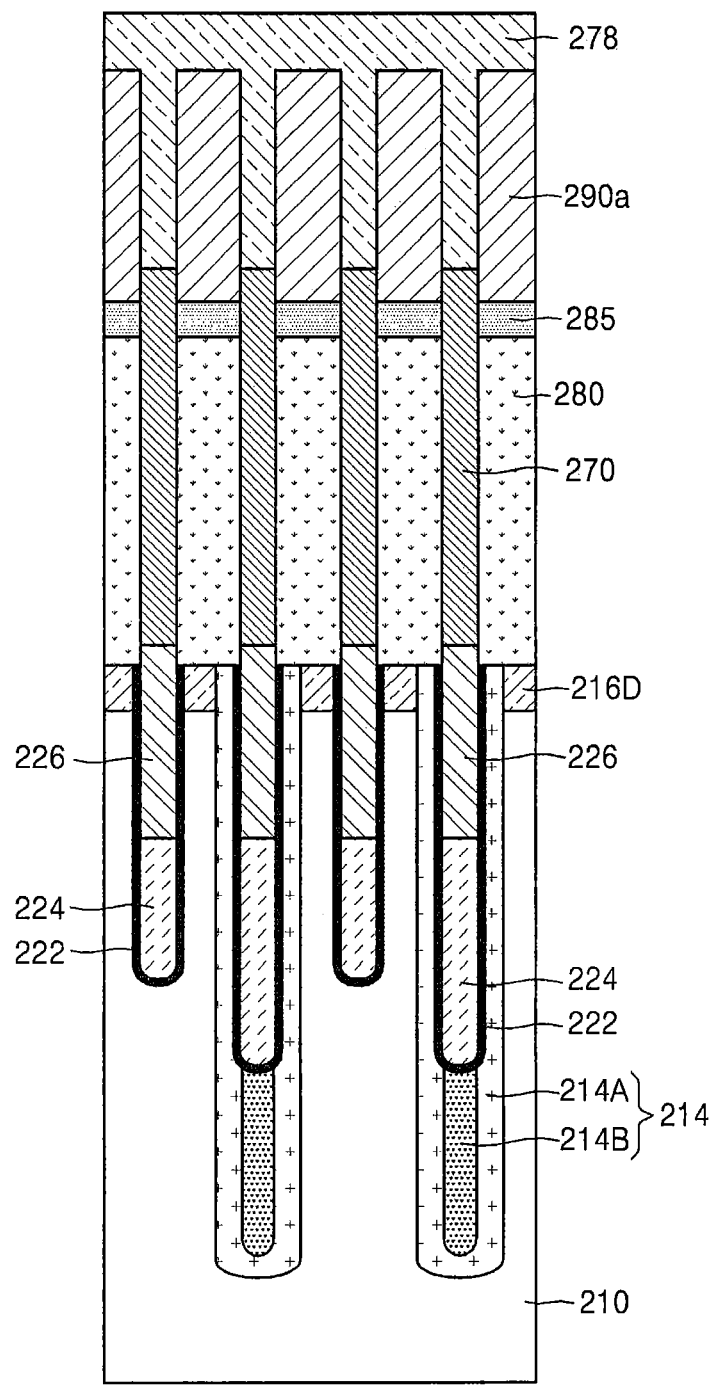

FIG. 9A is a plan view of a semiconductor device 200 including a dynamic random access memory (DRAM), according to an embodiment, and FIGS. 9B to 9D are respectively cross-sectional views taken along lines I-I', II-II', and III-III' of FIG. 9A.

Referring to FIGS. 9A to 9D, the semiconductor device 200 according to the present embodiment may include a plurality of active region layers (ACT) 216. The active region layer 216 may be defined by an element isolation film 214 on a substrate 210. As a design rule of a semiconductor device is reduced, the active region layers 216 may be disposed in a diagonal-line or oblique-line bar shape, as illustrated in FIG. 9A. A plurality of word lines (WL) or gate lines 224 may be disposed on the active region layers 216. The plurality of word lines or gate lines 224 may be across the active region layers 216 and extend in parallel to one another in a second direction (x direction). A plurality of bit lines (BL) 245 may be disposed on the word lines 224. The plurality of bit lines 245 may extend in parallel to one another in a first direction (y direction) perpendicular to the word lines 224.

The substrate 210 may be a p-type or n-type substrate and may be substantially the same as described above with reference to FIG. 2A. The element isolation film 214 may be one insulating film, or may include an external insulating film 214A and an internal insulating film 214B. Each of the active region layers 216 may be between the element isolation films 214, and heavily doped regions may be disposed in upper portions of the active region layers 216. For example, a source region 216S and a drain region 216D may be disposed in the upper portions of the active region layers 216.

The word line 224 may have a buried structure, and a top surface of the word line 224 may be lower in height than a top surface of the substrate 210. A bottom surface of the word line 224 may have an uneven shape, as illustrated in FIG. 9C, and a saddle FinFET may be disposed in the active region layer 216. In some embodiments, the word line 224 may include at least one selected from Ti, TiN, Ta, TaN, W, WN, TiSiN, and WSiN.

A gate dielectric film 222 may be between the word line 224 and the active region layer 216 and may include at least one selected from a silicon oxide film, a silicon nitride film, a silicon oxynitride film, an oxide/nitride/oxide (ONO) film, and a high-k dielectric film having a higher dielectric constant than a silicon oxide film. For example, the gate dielectric film 222 may have a dielectric constant of about 10 to about 25.

A buried insulating film 226 may be on the word line 224, and a top surface of the buried insulating film 226 may substantially the same level as the top surface of the substrate 210. The buried insulating film 226 may be one selected from a silicon oxide film, a silicon nitride film, a silicon oxynitride film, and combinations thereof.

An interlayer insulating film pattern 230 may be on the substrate 210 and may include a silicon oxide film 232 and a silicon nitride film 234. In some cases, the interlayer insulating film pattern 230 may be a single layer of silicon oxide. For example, the interlayer insulating film pattern 230 may include tetraethylorthosilicate (TEOS), high density plasma (HDP), or boro-phospho silicate glass (BPSG).

The semiconductor device 200 according to the present embodiment may include various contact arrays on the active region layers 216, for example, a direct contact (DC) 235, a buried contact (BC) 280, and a landing pad (LP) 290a. The direct contact 235 may mean a contact that connects the active region layer 216 to the bit line, and the buried contact 280 may mean a contact that connects the active region layer 216 to a lower electrode of a capacitor.

The direct contact 235 may contact the source region 216S of the active region layer 216, and a lower portion of the direct contact 235 may be surrounded by a spacer. The spacer may include a different material from the element isolation film 214.

Bit line structures 240 may extend in parallel to one another in a second direction (x direction) on the interlayer insulating film pattern 230 and the direct contact 235. Each of the bit line structures 240 may include a bit line 245 and an insulating capping line 248 that covers the top surface of the bit line 245. The bit line 245 may be electrically connected to the direct contact 235.

In some embodiments, the bit line 245 may include at least one selected from an impurity-doped semiconductor, a metal, metal nitride, and metal silicide. The bit line 245 may be a single layer, or may be a multi-layered film as illustrated. For example, the bit line 245 may have a structure in which doped crystalline silicon 242, tungsten nitride 244, and tungsten 246 are sequentially stacked.

A multi-layered spacer 250 may surround a sidewall of the bit line structure 240 and may include an insulating liner 252, a first spacer 254, and a second spacer 256. Some layers of the multi-layered spacer 250 may be omitted. In addition, the multi-layered spacer 250 may include an air spacer The buried contact 280 may be between the multi-layered spacers 250, and a bottom surface of the buried contact 280 may contact the drain region 216D. The buried contact 280 may include crystalline silicon (c-Si). In addition, the crystalline silicon may be doped with impurities. Accordingly, the buried contact 280 may correspond to the silicon layer of the semiconductor substrates 110 of FIGS. 2A to 2C, or 4A and 4B. The buried contact 280 may include a barrier film having a Ti/TiN stack structure.

A metal silicide layer 285 may be on the buried contact 280. The metal silicide layer 285 may be formed by siliciding the metal-silicon composite layer, as described above with reference to FIGS. 2A to 2C, or 4A and 4B. The metal silicide layer 285 may be, for example, cobalt silicide (CoSi$_x$). However, the metal silicide layer 285 is not limited to the cobalt silicide layer. For example, the metal silicide layer 285 may include various metals, such as a nickel silicide layer and a titanium silicide.

In general, due to the arrangement structure, a contact area between the buried contact 280 and the active region layer 216 may be very small. Accordingly, a conductive landing pad 290a may be introduced for increasing a contact area with the active region layer 216 and a contact area with the lower electrode of the capacitor. The landing pad 290a may be between the active region layer 216 and the buried contact 280, or may be between the buried contact 280 and the lower electrode of the capacitor. More specifically, the landing pad 290a may be on the metal silicide layer 285. The increase in the contact area through the introduction of the landing pad 290a may reduce a contact resistance between the active region layer 216 and the lower electrode of the capacitor.

The landing pad 290a may include a barrier film and a metal layer on the barrier film. In some embodiments, the barrier film may have a Ti/TiN stack structure as described above. In addition, in some embodiments, the metal layer may include tungsten.

A fence 270 may surround both sides of the buried contact 280 in the first direction (y direction) and may include an insulating material, such as oxide or nitride. In addition, a capping insulating film 278 may cover the landing pad 290a, and the capacitor may pass through the capping insulating film 278 and be electrically connected to the landing pad 290a.

In the semiconductor device 200 according to the present embodiment, the direct contact 235 may be in the central portion of the active region layer 216, and the buried contact 280 may be on both ends of the active region layer 216. Since the buried contact 280 is on both ends of the active region layer 216, the landing pad 290a may be adjacent to both ends of the active region layer 216 and partially overlap the buried contact 280.

The word line 224 may be buried in the substrate 210 of the semiconductor device 200 and may be across the active region layer 216 between the direct contact 235 and the buried contact 280. As illustrated, two word lines 224 may be across one active region layer 216, and the active region layer 216 may be obliquely arranged to form an angle less than 90 degrees with respect to the word lines 224.

The direct contact 235 and the buried contact 280 may be symmetrically arranged. Accordingly, the direct contact 235 and the buried contact 280 may be linearly arranged along the x axis and the y axis. Unlike the direct contact 235 and the buried contact 280, the landing pads 290a may be arranged in zigzag form L1 in the first direction (y direction) in which the bit line 245 extends.

The semiconductor device 200 according to the present embodiment may constitute, for example, a DRAM device. In addition, the semiconductor device 200 according to the present embodiment may include a metal silicide layer 285 on the buried contact 280. The buried contact 280 may include, for example, crystalline silicon (c-Si). In the semiconductor device 200 according to the present embodiment, since the metal silicide layer 285 is formed by siliciding the metal-silicon composite layer, impurity ions may be aggregated at a high concentration in the interface between the metal silicide layer 285 and the silicon layer, i.e., the buried contact 280. Therefore, a contact resistance between the metal silicide layer 285 and the buried contact 280 may be reduced.

While the inventive concept has been particularly shown and described with reference to embodiments thereof, it will be understood that various changes in form and details may be made therein without departing from the spirit and scope of the following claims.

What is claimed:

1. A method of forming a metal silicide layer, the method comprising:
    forming a doped layer including segregation dopants on a surface of a semiconductor substrate;
    forming a metal-silicon composite layer by depositing a metal and silicon on the doped layer; and
    forming the metal suicide layer by siliciding the metal-silicon composite layer;
    wherein forming the metal-silicon composite layer comprises forming a plurality of amorphous silicon (a-Si) layers on the doped layer and at least one metal layer between the plurality of amorphous silicon layers.

2. The method of claim 1, wherein forming the metal silicide layer comprises forming the metal silicide layer to aggregate the segregation departs at an interface between the metal silicide layer and the doped layer.

3. The method of claim 1, wherein forming the metal suicide layer comprises forming the metal silicide layer to reduce a thickness of the doped layer.

4. The method of claim 1, wherein forming the metal silicide layer comprises forming the metal silicide layer to aggregate the segregation dopants at an interface between the metal suicide layer and the doped layer.

5. The method of claim 1, wherein forming the doped layer comprises implanting or diffusing the segregation departs into the doped layer to a depth of about 10 nm or less into the surface of the semiconductor substrate.

6. The method of claim 1, wherein the metal comprises a noble metal or a near noble metal, and forming the metal-silicon composite layer comprises supplying the silicon and the metal by a physical vapor deposition (PVD) process or a chemical vapor deposition (CVD) process.

7. The method of claim 6, wherein forming the metal-silicon composite layer comprises performing a co-sputtering deposition process of simultaneously sputtering the silicon and the metal, a composite target sputtering deposition process to sputter a silicon-metal composite, and a metal/silicon multi-layer deposition process to form a multi-layer structure comprising a metal layer and a silicon layer.

8. The method of claim 1, wherein forming the metal suicide layer comprises performing a heat treatment at a particular temperature range or laser annealing.

9. The method of claim 1, wherein forming the doped layer comprises generating defects for Fermi level pinning.

10. A method of manufacturing a semiconductor device, the method comprising:
- forming an insulating layer on a semiconductor substrate including an active region;
- forming a contact hole through the insulating layer to expose the active region;
- providing silicon and a metal to the active region in the contact hole and on the insulating layer;
- performing a silicidation process on the silicon and the metal in the contact hole to provide a metal silicide layer on the active region in the contact hole and on the insulating layer; and
- forming a metal contact layer on the metal silicide layer;
- wherein performing the silicidation process further comprises:
- forming a doped layer including dopants on a surface of the active region;
- forming a metal-silicon composite layer from the metal and the silicon on the doped layer and the insulating layer; and
- performing the silicidation process on the metal-silicon composite layer.

11. The method of claim 10, wherein performing the silicidation process comprises aggregating dopants at an interface between the metal silicide layer and the doped layer to reduce a thickness of the doped layer relative to before formation of the metal silicide layer.

12. The method of claim 10, after forming the metal contact layer, the method further comprising:
removing the metal silicide layer on the insulating layer outside the contact hole.

13. The method of claim 10, wherein the active region comprises a source/drain region, and the metal silicide layer provides an interface layer between the source/drain region and the metal contact layer.

14. A method of forming a metal silicide layer, the method comprising:
- implanting dopants to a first depth below a surface of a semiconductor substrate including an active area;
- forming a metal-silicon composite layer on the semiconductor substrate; and
- siliciding the metal-silicon composite layer to form the metal silicide layer on the active area;
- wherein the metal-silicon composite layer comprises a double layer of a silicon layer in a lower portion thereof and a metal layer in an upper portion thereof, and
- silicon of the silicon layer and silicon of the semiconductor substrate are used in the siliciding.

15. The method of claim 14, wherein the dopants provide defects for Fermi level pinning.

16. The method of claim 14, wherein siliciding the metal-silicon composite layer comprises shielding the metal-silicon composite layer so that the surface of the semiconductor substrate moves downward and approaches the first depth.

17. The method of claim 16, wherein the dopants are aggregated in an interface between the semiconductor substrate and the metal suicide layer.

* * * * *